(12) United States Patent
Parrill et al.

(10) Patent No.: US 7,897,945 B2
(45) Date of Patent: Mar. 1, 2011

(54) HYDROGEN ION IMPLANTER USING A BROAD BEAM SOURCE

(75) Inventors: Thomas Parrill, Andover, MA (US); Victor Benveniste, Lyle, WA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 316 days.

(21) Appl. No.: 12/237,963

(22) Filed: Sep. 25, 2008

(65) Prior Publication Data

US 2010/0072401 A1    Mar. 25, 2010

(51) Int. Cl.
*H01J 37/30* (2006.01)
(52) U.S. Cl. .................................. 250/492.21
(58) Field of Classification Search ............. 250/492.21, 250/398
See application file for complete search history.

(56) References Cited

U.S. PATENT DOCUMENTS

| | | | |
|---|---|---|---|
| 4,350,927 A | 9/1982 | Maschke | |
| 4,447,732 A | 5/1984 | Leung et al. | |
| 4,794,298 A | 12/1988 | Proudfoot | |
| 5,023,458 A | 6/1991 | Benveniste et al. | |
| 5,350,926 A | 9/1994 | White et al. | |
| 5,568,021 A | 10/1996 | Bederka et al. | |
| 5,661,308 A | 8/1997 | Benveniste et al. | |
| 6,305,316 B1 | 10/2001 | DiVergilio et al. | |
| 6,504,159 B1 | 1/2003 | Keller | |
| 6,664,548 B2 | 12/2003 | Benveniste et al. | |
| 6,927,148 B2 | 8/2005 | Ito | |
| 7,394,202 B2 | 7/2008 | Horsky et al. | |
| 7,687,786 B2 * | 3/2010 | Parrill et al. ............. | 250/492.21 |

OTHER PUBLICATIONS

Walther, S.R. et al. *Ion Sources for Commercial Ion Implanter Applications*, pp. 2088-2092, Varian Ion Implant Systems, Gloucester, MA, PAC 1991.

Vainionpaa, Jaakko Hannes et al. *Ion Source for Neutral Beam Injection Meant for Plasma and Magnetic Field Diagnostics*. 3 pgs. Review of Scientific Instruments 79, 02C102, Jan. 17, 2008.

Benveniste, V.M. et al. *ULE Beamline Optics*. pp. 432-435, Eaton Corp., S.E.D. Beverly, MA, 1999.

Gammel, G.M. *New High-brightness Multiple Beam Linear Accelerator*. pp. 971-974. Brookhaven National Laboratory, Upton, NY, Apr. 1, 1981.

Kushin, V.V. et al. *Multiple Channel Accelerator Structure with Space Lattice Focusing for Experimental Ion Linac*. pp. 860-862. EPAC 2000, Vienna, Austria.

* cited by examiner

*Primary Examiner* — Kiet T Nguyen
(74) *Attorney, Agent, or Firm* — Cesari and McKenna, LLP

(57) ABSTRACT

Ion implanters incorporating multibeam ion sources are used to meet process dose and energy demands associated with fabricating a thin lamina for use in photovoltaic devices. The thin lamina are formed by ion implantation followed by cleaving.

15 Claims, 11 Drawing Sheets

HYDROGEN ION IMPLANTER USING A BROAD BEAM SOURCE

BACKGROUND OF THE INVENTION

1. Field of the Invention

This invention relates to ion implanters for preparing semiconductor lamina, and, in particular, ion implanters used for economical production of photovoltaic cells.

2. Background Information

As the demand for electrical energy based on renewable sources increases, the implementation of photovoltaic technology has expanded dramatically in recent years. Nevertheless, a way of forming crystalline semiconductor bodies, specifically silicon, optimized for photovoltaic cells has remained somewhat elusive.

Crystalline silicon wafers adapted to bear photovoltaic cells are conventionally obtained by slicing a silicon ingot. This process, which typically yields a silicon wafer thicker than 150 µm, wastes a substantial amount of silicon by consuming up to 50% of the silicon body in kerf loss and delivering a much greater thickness than is needed for useful photovoltaic devices.

Thinner silicon laminae have been made by exfoliation of a film by annealing after high-dose ion implantation. The films produced this way have found application in forming silicon-on-insulator structures but are cost-prohibitive for solar cells. Also, at thicknesses well under 1 µm, the films may be so thin as to make efficient light-capturing difficult.

There is, accordingly, a need for a more cost-effective way to form silicon bodies optimized for photovoltaic applications.

SUMMARY OF THE INVENTION

In a first embodiment, the invention provides a method of making a lamina for fabricating a photovoltaic device. The method comprises installing a semiconductor wafer in an appliance configured to hold the wafer. An ion source configured to supply hydrogen or helium ions is operated to generate a plurality of ion beamlets. The plurality of ion beamlets are directed toward the appliance in a beam constituting a current of at least 20 mA of hydrogen or helium ions. Ions in the directed ion beamlets implant in the wafer at a depth defining a cleave plane. The wafer is annealed to effect cleaving of a lamina from the wafer at the cleave plane. The lamina may be at least 1 µm thick and suitable for fabricating a photovoltaic device.

In another embodiment, the invention provides a related ion implanter adapted to implant ions in semiconductor wafers. The ion implanter comprises a wafer-holding appliance constructed of a partition arranged about an axis. Pads on the interior side of the partition are adapted to hold semiconductor wafers with front surfaces facing and equidistant from the axis. An ion train is adapted to direct a beam of ions having energies of at least about 200 keV toward the pads on the interior side of the appliance. A control system is adapted to rotate the partition about the axis so that the front surfaces of the wafers successively pass through the beam. The ion beam may constitute a current of at least 5 mA of ions.

In yet another embodiment, the invention provides another related ion implanter adapted to implant ions in semiconductor wafers. The ion implanter comprises a disk bearing pads for holding semiconductor wafers. A control system is adapted to rotate the disk about a fixed axis. An ion train directs an ion beam at the disk. The ion beam has a width that varies, in a direction perpendicular to the radius of the disk, proportionally to the reciprocal of radial position on the disk.

BRIEF DESCRIPTION OF THE DRAWINGS

The invention description below refers to the accompanying drawings, of which.

Figure 1:
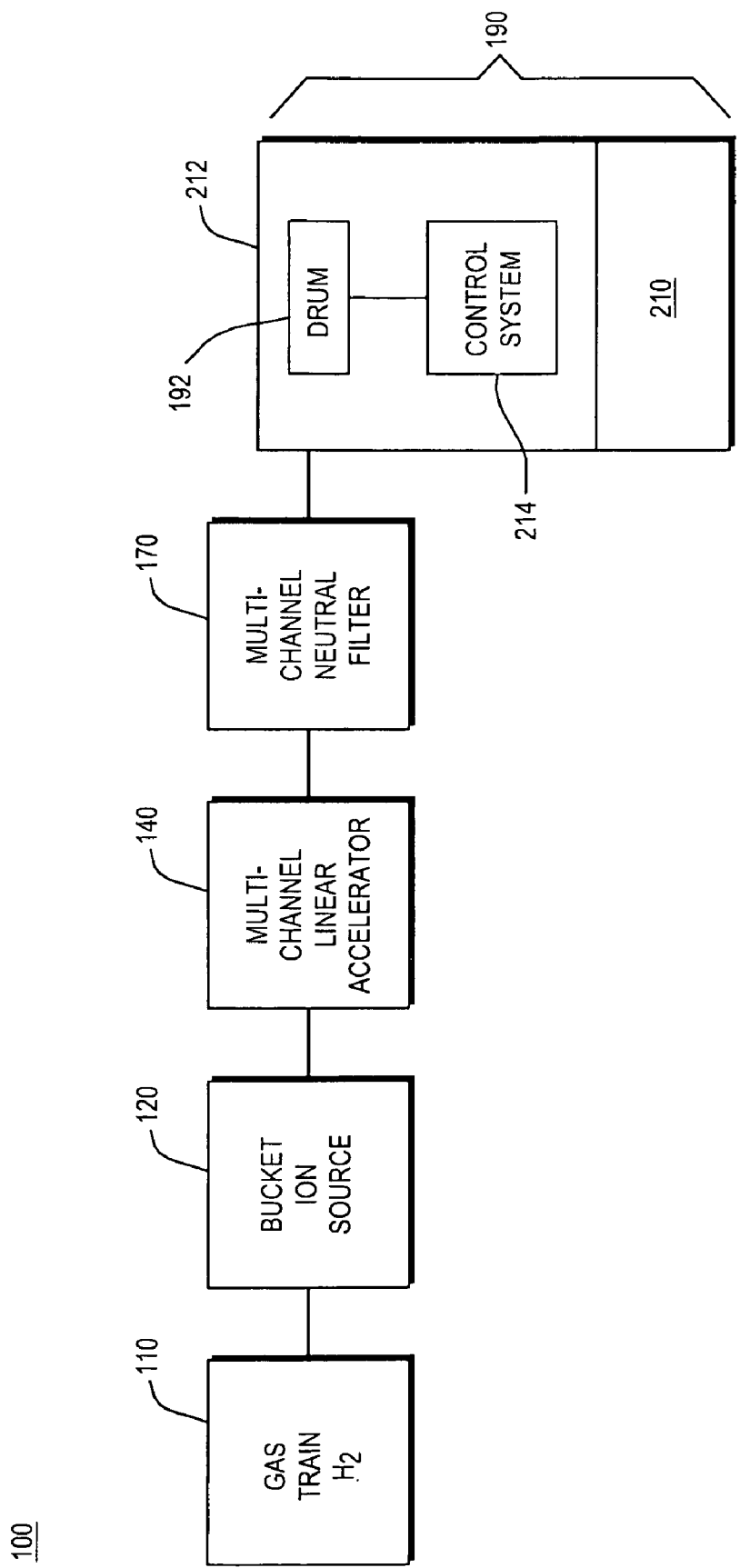
FIG. 1 is a block diagram of an inventive ion implanter configured to implant hydrogen ions in square semiconductor wafers.

Features in the drawings are not, in general, drawn to scale.

DETAILED DESCRIPTION OF AN ILLUSTRATIVE EMBODIMENT

The invention relates to ion implanters useful for economically implanting semiconductor wafers preparatory to photovoltaic cell fabrication. Techniques for making semiconductor laminae for photovoltaic applications by cleaving after high-dose implantation of hydrogen or helium are described in co-owned U.S. application Ser. No. 12/057,265, Sivaram et al., "Method to Form a Photovoltaic Cell Comprising a Thin Lamina," the disclosure of which is incorporated herein by reference. Hydrogen, helium, or both are implanted in a wafer of semiconductor material, such as monocrystalline silicon, at a depth defining a cleave plane, which determines a lamina thickness. Removal of the lamina from the implanted wafer is effected by, for example, annealing the wafer to provoke exfoliation of the lamina at the cleave plane.

For preparation of efficient photovoltaic devices, lamina thicknesses of about 1 µm and greater are desirable. The location of the cleave plane is related to the depth at which implanted ions come to rest in the wafer, which is largely dependent on the terminal ion energy, or implant energy. Accordingly, an ion implanter useful for making laminae by this method preferably delivers an implant energy of at least 100 keV and more preferably encompassing implant energies between 100 keV and values such as 150 keV, 200 keV, 250 keV, or 300 keV, 400 keV, 500 keV or greater. The optimal implant dose is on the order of $10^{16}$ ions/cm² or $10^{17}$ ions/cm². These process parameters translate into high voltage demands and relatively high ion beam current and/or long process times, all of which contribute to noncompetitive economics for photovoltaics fabrication.

The invention provides implanters constructed for a single process—implanting either hydrogen or helium at a predetermined beam current and implant energy—which forego unnecessary subsystems and optimize components to the chosen reactants and process requirements. By contrast with multipurpose conventional ion implanters used to produce integrated circuits on silicon wafers, the illustrative implanters of the invention are tailored to a single process scenario consistent with photovoltaics fabrication. With unneeded adjustment capabilities eliminated, inventive implanters dedicated to a single process can meet implant energy and throughput demands at practicable cost.

In order to economically deliver high implant energy values and doses, the high-current implanters described herein in accordance with illustrative embodiments of the present invention are constituted for high throughput by delivering more ions per operating time and per batch loaded with simplified architecture for economical construction and maintenance. To this end, the high-current implanters may be configured to generate irradiating ion beams having cross sections sufficiently large to obviate beam rastering and the attendant scanning capability. An illustrative implanter may incorporate a multibeam current source capable of generating an aggregate ion beam having a cross section greater than 200 cm² and constituting a current of at least 5 mA, more preferably greater than 20 mA, as great as 50, 100, 200, 300, 400 or 500 mA.

One aspect of the inventive ion implanter is the source of the ions providing hydrogen or helium ions for implantation. In one embodiment, a high-current ion implanter of the invention may incorporate a large-volume, or "bucket," source of hydrogen or helium ions. Bucket sources may be rectangular or cylindrical chambers with a peripheral array of permanent magnets of alternating polarity which confines an enclosed plasma through multicusp magnetic fields. The plasma may be generated by delivering RF or microwave energy to a source gas admitted to the chamber. A portion of the large-cross-section irradiating beam, a "beamlet," is extracted through each one of an array of apertures, for example circles or slits.

The features of the chamber, such as size and magnet configuration, are chosen to produce a "field-free" region inside the chamber of sufficient extent to accommodate a plasma supporting a suitably uniform extracted aggregate beam. In the embodiments, the number, shape and arrangement of the apertures are chosen conjunctionally with the geometry of the endstation bearing the semiconductor wafers to produce an efficient beam profile. For example, a trapezoidal beam profile may be used to irradiate wafers mounted on a disk with an axis of rotation nearly parallel to the beam, and a rectangular beam profile may be used for wafers mounted on a drum with an axis of rotation nearly perpendicular to the beam.

Bucket sources are scalable to produce aggregate beams constituting a hydrogen- or helium-ion current of several hundreds of milliamps and having a dimension greater than 30 cm, accommodating a plasma large enough to irradiate commonly produced silicon wafers without rastering. The bucket source is well-suited to long-term use with hydrogen or helium because these ions are not prone to deposit on or sputter chamber components, in contrast to many of the more frequently implanted, heavier elements.

Another aspect of the inventive implanters pertains to the acceleration apparatus by which implant energies suitable for photovoltaics preparation are realized. In one embodiment, the ion implanter of the invention may incorporate a multichannel linear accelerator, by which the ions from the multibeam source of the invention are accelerated to implant energies of at least 100 keV. With choosing the number and features of acceleration stages in the multichannel accelerator, the invention provides an implanter tailored to implant ions at energies of 200 keV, 300 keV, 400 keV, 500 keV or greater. The multichannel linear accelerator is adapted to accelerate ions to the desired energies while preserving the extracted geometry of the beam profile.

Also, the multichannel linear accelerator allows implant energies of interest to be achieved in the high-current beam without the insulation challenges of dc acceleration columns. Linear acceleration also serves to segregate extraneous ions from the ions of interest without the expense or complexity of a distinct mass analysis unit, as is typically used in conventional implanters. Alternatively, the acceleration apparatus may bring ions to the implant energy by a dc column or a tandem accelerator.

In another aspect, the invention provides a multichannel neutral filter adapted to remove extraneous neutral particles from the ion beamlets forming the large-cross-section, shape-tailored irradiating beam. The multichannel filter provides a curved interstice for each beamlet extracted from the high-volume ion source. Each interstice is bounded by electrodes producing a dc electric field causing the beamlet to bend through the interstice and emerge to advance to the wafers. Neutral particles in each beamlet are caught by a grounded electrode bounding the interstice.

In a conventional implanter, the wafers are typically disposed in an annulus around the center of a rotating disk, with relative motion effected between the beam and rotating disk so as to raster the beam over the disk for a uniform implant. By contrast, in embodiments of the inventive high-current implanter, the simplified endstation control system is configured to pass the wafers through the beam successively, without rastering. The large-cross-section, shape-tailored beam produced by the multibeam ion source and preserved by the multichannel accelerator and filter enable the beam to irradiate the entire wafer uniformly as it simply passes through the beam.

For example, in one embodiment, the inventive high-current implanter incorporates a rotatable disk as an endstation appliance bearing, for example, round wafers. The appliance cooperates with an ion source configured to generate an irradiating beam having a trapezoidal cross section. The beam profile width depends on radial distance r from the rotational axis of the wafer-bearing appliance as 1/r, compensating for the mismatch in linear velocity between the inner and outer portions of the disk.

In another embodiment, the inventive high-current implanter incorporates a rotatable drum, for example, a cylinder or cone, as an endstation appliance supporting round wafers. The drum cooperates with an ion source configured to generate an irradiating beam having a rectangular cross section. Alternatively, the drum is adapted to support fully square or corner-clipped square wafers, tiled to increase the implanted area per batch loaded. The drum may support the wafers parallel to or at an angle of up to about 10 degrees with the spinning axis. The drum geometry allows a parallel or near-parallel orientation of the wafer faces with respect to the rotation axis, so that wafers are clamped against supporting pads with a force approximately eight times the force pushing wafers against pads in a rotating conventional small-angle cone disk. The intensified clamping force facilitates removal of heat transmitted to the wafers by high implantation-beam currents.

Inventive high-current implanters incorporating a spinning drum may have an endstation configured so that wafers on a first spinning drum are implanted in a process chamber while a second spinning drum is prepared for implantation in a second process chamber or a dedicated staging area. In this case, the second drum can be ready to begin implantation while the first, completed drum is being removed. The configuration reduces implanter downtime and thereby increases throughput for more economical production of photovoltaics. The invention may incorporate any or several of these features in an ion implanter configured to make economically competitive solar cells.

With reference to FIG. 1, in an illustrative embodiment, a high-current ion implanter 100 comprises a cylindrical bucket ion source 120, supplied with hydrogen through a gas train 110, a multichannel linear accelerator 140, a multichannel neutral filter 170, and an endstation 190.

The gas train 110 may include a hydrogen gas source connected to a flow controller configured to provide hydrogen gas to the ion source 120 at a flow rate of about 10 sccm.

Figure 2:
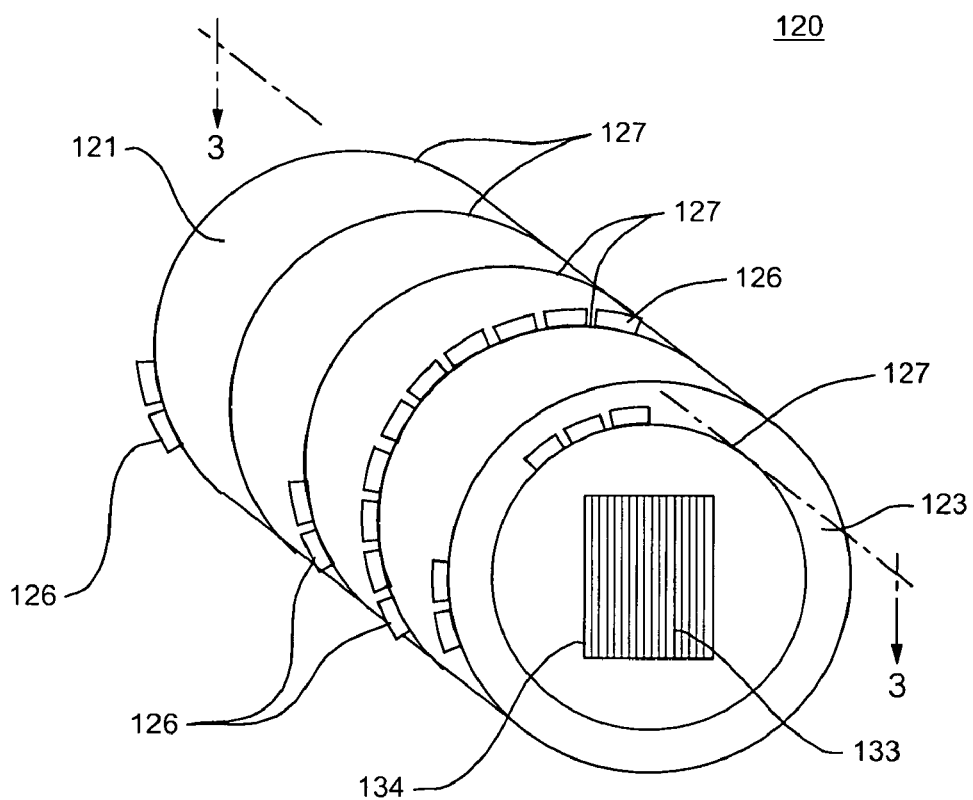
FIG. 2 is a prospective view of a cylindrical bucket ion source, compatible with the invention, having slits for the extraction of beamlets.
Figure 3:
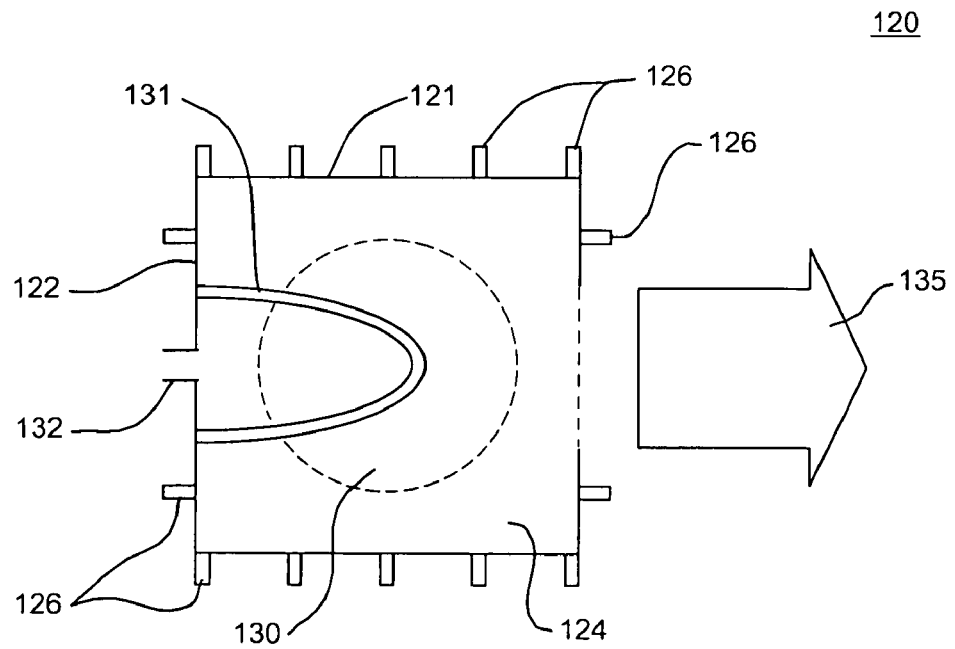
FIG. 3 is a sectional view taken along a line 3-3 in FIG. 2.

FIGS. 2 and 3 show the cylindrical bucket source 120 comprising a cylindrical wall 121, a closed end 122 and an apertured end 123 defining a chamber 124. The chamber cylindrical wall 121 has axial length and diameter both equal, illustratively, to 400 mm. The wall 121 and closed end 122 are, illustratively, of aluminum. The apertured end 123 may be of graphite.

Magnets 126, which may be identical permanent samarium-cobalt magnets, may be disposed in rings 127 outside the chamber 124 on the cylindrical wall 121, the closed end 122, and the apertured end 123. The magnets 126 of a single ring 127 are oriented to contribute an inward- or an outward-directed magnetic field. The magnets 126 are arrayed so that adjacent rings 127 have opposite magnetic field orientations. The resulting multicusp magnetic field has a steep gradient in the chamber 124 near the wall 121. Away from the wall 121 is a so-called field-free region 130 in which a plasma may be confined.

An RF antenna 131 extends from the closed end 122 into the field-free region 130 of the chamber 124. The antenna 131 may be encased in quartz to limit metal contamination of plasma in the ion source 120. An RF power supply configured to provide excitation at 13.56 MHz and impedance matching network (not shown) are at the ion source potential and supplied by an isolation transformer. A gas feed port 132, which may be quartz, may be located in the closed end 122 and communicates with the gas train 110.

The apertured end 123 serves as an extraction face, having twenty-one fixed vertical slits 133 through which ions may be extracted from the chamber 124. Each slit 133 is, illustratively, 180 mm high and 2 mm wide, with 10 mm separating centers of adjacent slits 133. The slits are rectangular and mutually parallel, together forming a rectangular profile 134 centered on the apertured end 123. The profile 134 is 180 mm high and 122 mm wide, smaller than a projection of the field-free region 130 onto the apertured end 123. An extraction apparatus 138 (FIG. 4) is configured to apply an extraction voltage, adjustable, illustratively, over a range from 10 kV to 40 kV, across the slits 133. The extraction voltage is disposed to electrostatically impel ions from the chamber 124 through each of the slits 133 and steer them in twenty-one beam portions, or beamlets, toward the linear accelerator 140 along parallel beamlet extraction pathways 135.

Design variations of the bucket ion source compatible with hydrogen ion generation, such as alternative materials or field designs, are known to those skilled in the art.

Figure 4:
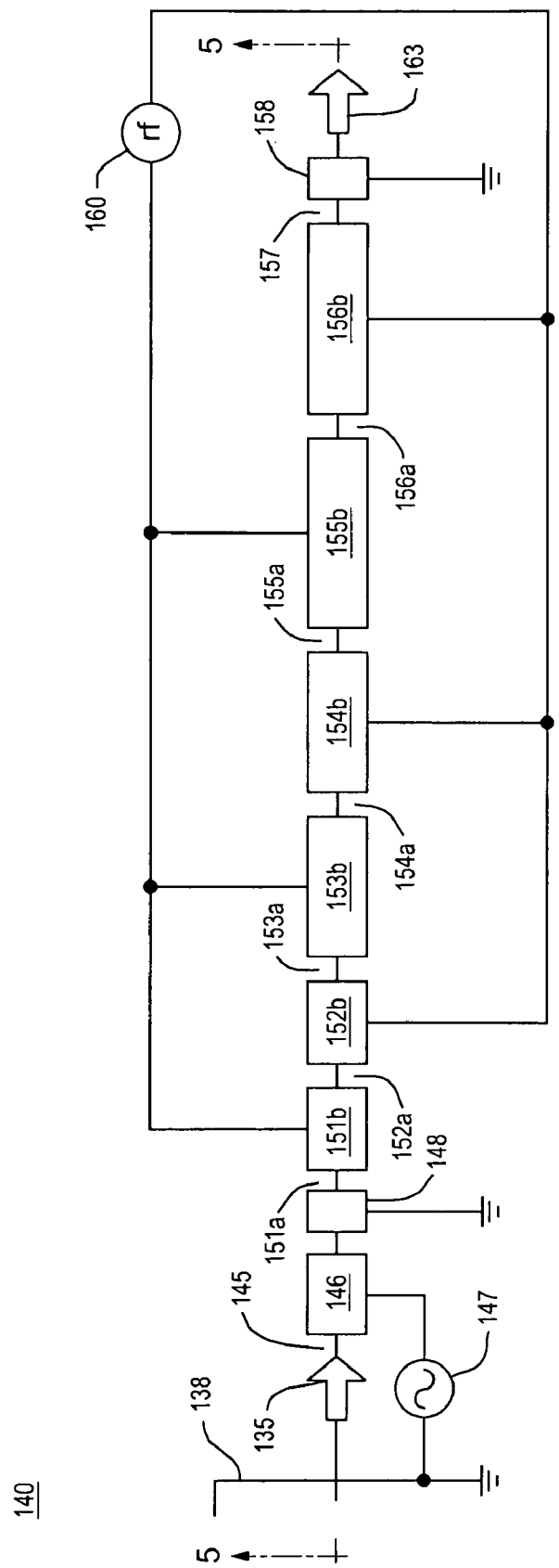
FIG. 4 is a schematic cross section of a multichannel linear accelerator compatible with the invention.

With reference to FIG. 4, the six-stage multichannel linear accelerator ("linac") 140 configured to accelerate ions to an implant energy of about 400 keV comprises a sawtooth buncher and successive acceleration stages. The sawtooth buncher comprises a buncher drift block 146 which is, illustratively, 62.5 cm long. A voltage source 147 is configured to apply a sawtooth signal, having a magnitude smaller than about 5 kV, across a buncher gap 145 between the extraction apparatus 138 and the buncher drift block 146.

An acceleration stage is made up of a drift block and a gap separating the drift block from a previous acceleration stage. For example, a first gap 151a and first drift block 151b constitute a first acceleration stage. A second gap 152a and second drift block 152b constitute a second acceleration stage. A third gap 153a and third drift block 153b constitute a third acceleration stage. A fourth gap 154a and the fourth drift block 154b constitute a fourth acceleration stage. A fifth gap 155a and fifth drift block 155b constitute a fifth acceleration stage. A sixth gap 156a and sixth drift block 156b constitute a sixth acceleration stage. A final gap 157 separates the sixth drift block 156b from a linac exit block 158.

The ground electrode block 148 and the linac exit block 158 are both at ground potential. The first 151b, third 153b and fifth 155b drift blocks are electrically connected. The second 152b, fourth 154b and sixth 156b drift blocks are electrically connected. A balanced RF voltage source 160 is configured to provide 64 keV peak to peak at 13.56 MHz across the odd- and even-numbered drift blocks. Use of a balanced RF source allows the length of the acceleration stages to be reduced by ½ compared to stages in a linac using an unbalanced drive.

A balanced resonator (not shown), coupled inductively or capacitively to the balanced RF voltage source 160, may reside in vacuum. A variable capacitor may be provided to enable dynamic tuning of the resonator for compensating for thermal distortions. A small variable capacitor may be provided between each of the drift blocks 146, 151b, 152b, 153b, 154b and 156b and ground to allow phase adjustment for longitudinal focusing.

Figure 5:
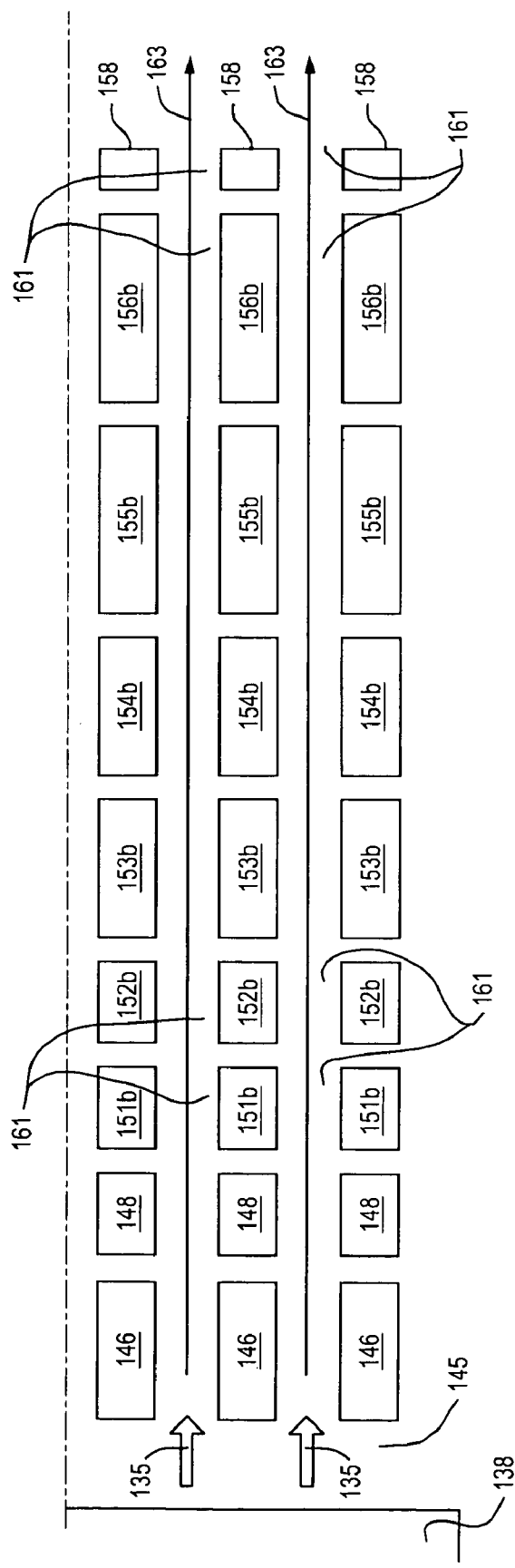
FIG. 5 is a partial cross section of the multichannel linear accelerator taken along a line 5-5 in FIG. 4.

With reference to FIG. 5, each of the blocks 146, 151b, 152b, 153b, 154b, 155b, 156b and 158 has twenty-one parallel channels 161 therethrough, the channels functioning as drift tubes. The blocks 146, 151b, 152b, 153b, 154b, 155b, 156b and 158 are oriented so as to align the channels 161 to compose twenty-one gapped conduits through the linac. The gapped conduits are configured to accommodate twenty-one accelerated beamlet pathways 163, of which two are shown in FIG. 5, aligned with the beamlet extraction pathways 135. The blocks 146, 151b, 152b, 153b, 154b, 155b, 156b and 158 are supported and aligned by quartz insulators.

Each channel 161 is elongated perpendicular to the beamlet pathways 163 to accommodate the slit profile of the corresponding hydrogen ion beamlet. The length of the first 151b and sixth drift 156b blocks is $\lambda/2$, where $\lambda$ is the distance traversed by a bunched beamlet during one period of the RF signal provided by the source 160. The length of the intermediate drift blocks 152b, 153b, 154b and 155b is $\lambda$. The length of the drift blocks 152b, 153b, 154b and 155b and therefore of the channels 161, increases along the beamlet pathways 163 through the linac 140, concomitant with the increasing velocity of the hydrogen ions. The height of the channels 161, perpendicular to the beamlet pathways 163 and to the plane common to the beamlet pathways 163, also decreases along the beamlet pathways 163 to match the beamlet height reduction as the hydrogen ions become more energetic. The blocks 146, 151*b*, 152*b*, 153*b*, 154*b*, 155*b*, 156*b* and 158 are arranged so that the lengths of gaps 145, 151*b*, 152*b*, 153*b*, 154*b*, 155*b*, 156*b*, and 157 provide a desired amount of vertical focusing.

Figure 6:
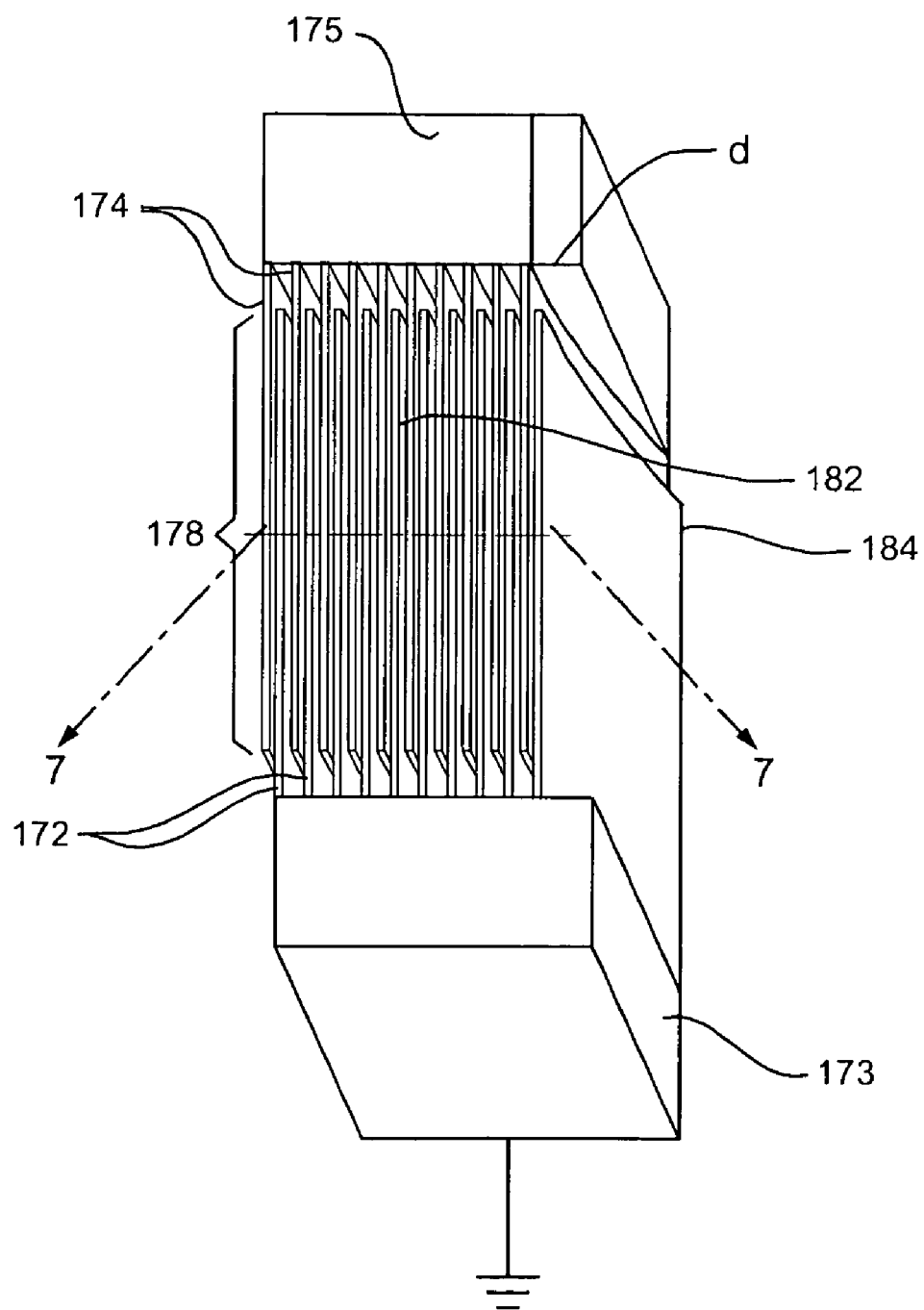
FIG. 6 is a prospective view of the multichannel neutral filter compatible with the invention.
Figure 7:
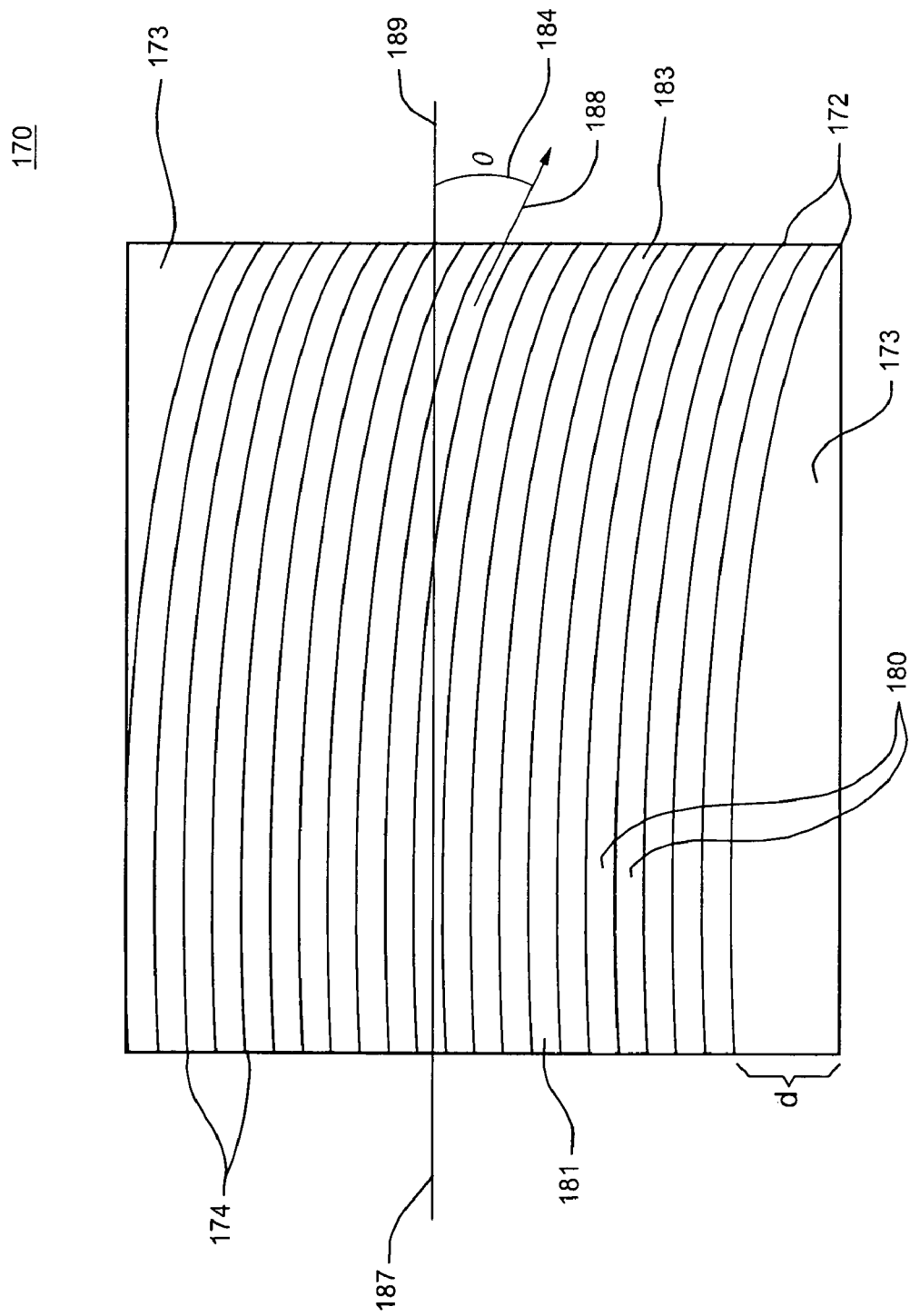
FIG. 7 is a sectional view of the multichannel neutral filter taken along the line 7-7, toward the block 173, of FIG. 6.

With reference to FIGS. 6 and 7, the multichannel neutral filter 170 may comprise a first array of first curved parallel electrodes 172 joined at a first conductive block 173. A second array of second parallel electrodes 174 may be joined at a second conductive block 175. The first electrodes 172 and second electrodes 174 are mutually parallel and interleaved to form a filtering section 178 of twenty-one curved interstices 180, having a bending radius of about 2 m between adjacent first and second electrodes 172 and 174. The filtering section 178 has a width sufficient to accommodate the hydrogen ion beamlets.

Each interstice 180 has an entrance 181 on an entrance face 182 of the filtering section 178 and an exit 183 on an exit face 184 of the filtering section 178. The distance between the entrance 181 and exit 183 for each interstice 180, projected onto the entrance face 182, is d≈1.5 cm. Each interstice 180 is perpendicular to the entrance face 182 at its entrance 181. The electrodes are about 25 cm long, with first 172 and second 174 electrodes about 3 mm apart.

The interstices are configured to receive each ion beamlet along a beamlet entry pathway 187 aligned with the beamlet pathway 163 and to dispatch the beamlet from the exit face 184 along a corresponding beamlet exit pathway 188. The beamlet entry pathways 187 are perpendicular to the entrance face 182. An extrapolation 189 of an entry beamlet pathway 187 forms an angle θ, which may be about 7 degrees with a corresponding exit beamlet pathway 188. The multichannel filter 170 is disposed in the ion implanter 100 so as to align the twenty-one beamlet entry pathways 187 with the beamlet pathways 163 of the linear accelerator 140.

A dc voltage source is configured to maintain a potential difference between the first electrodes 172 and the second electrodes 174. The potential difference is chosen to generate a field deflecting the path of a hydrogen ion through the bending radius of the interstices 180. Fluid channels (not shown) in the first and second blocks 173 and 175 and in the electrodes 172 and 174 accommodate coolant flow.

Figure 8:
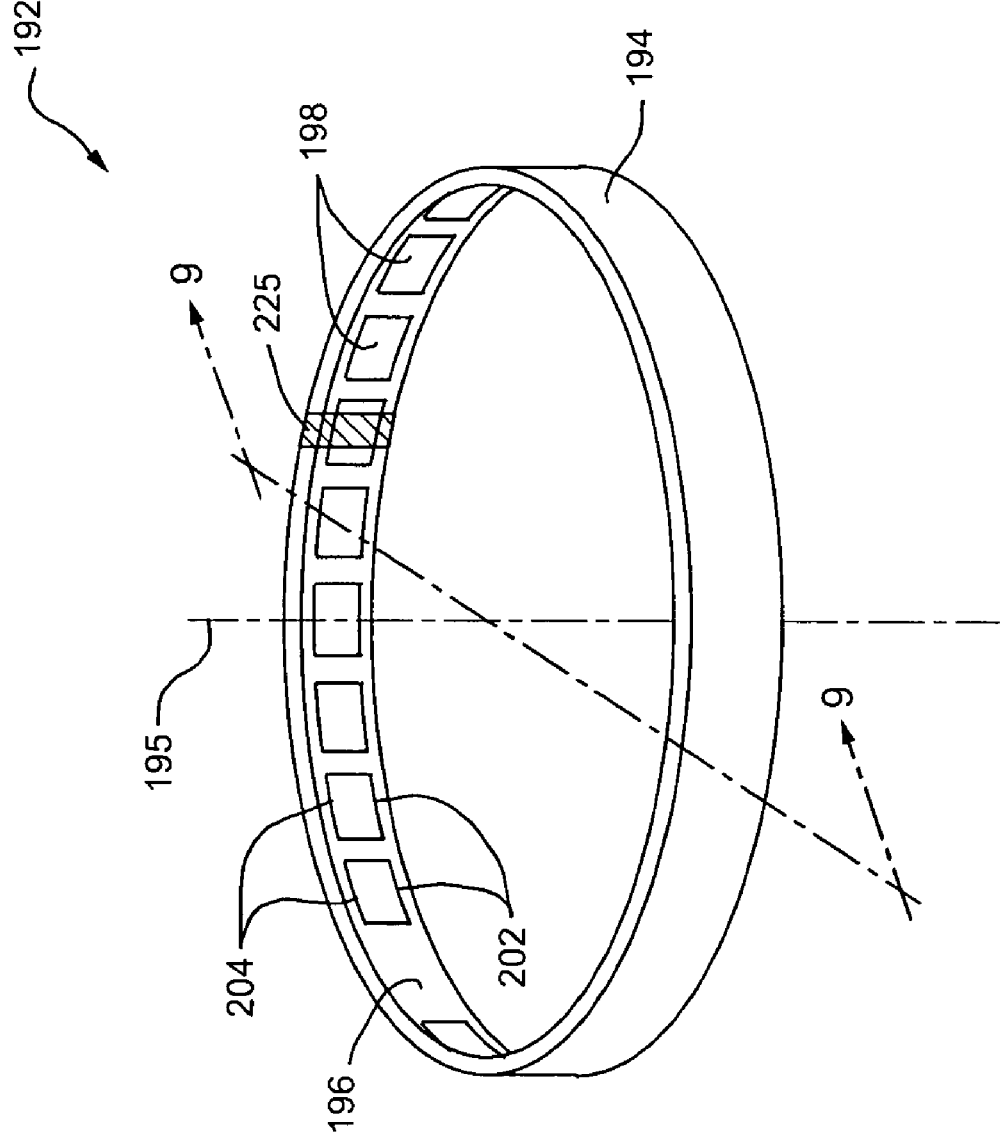
FIG. 8 is a prospective view of a spinning drum appliance, compatible with the invention, configured to support square wafers.
Figure 9:
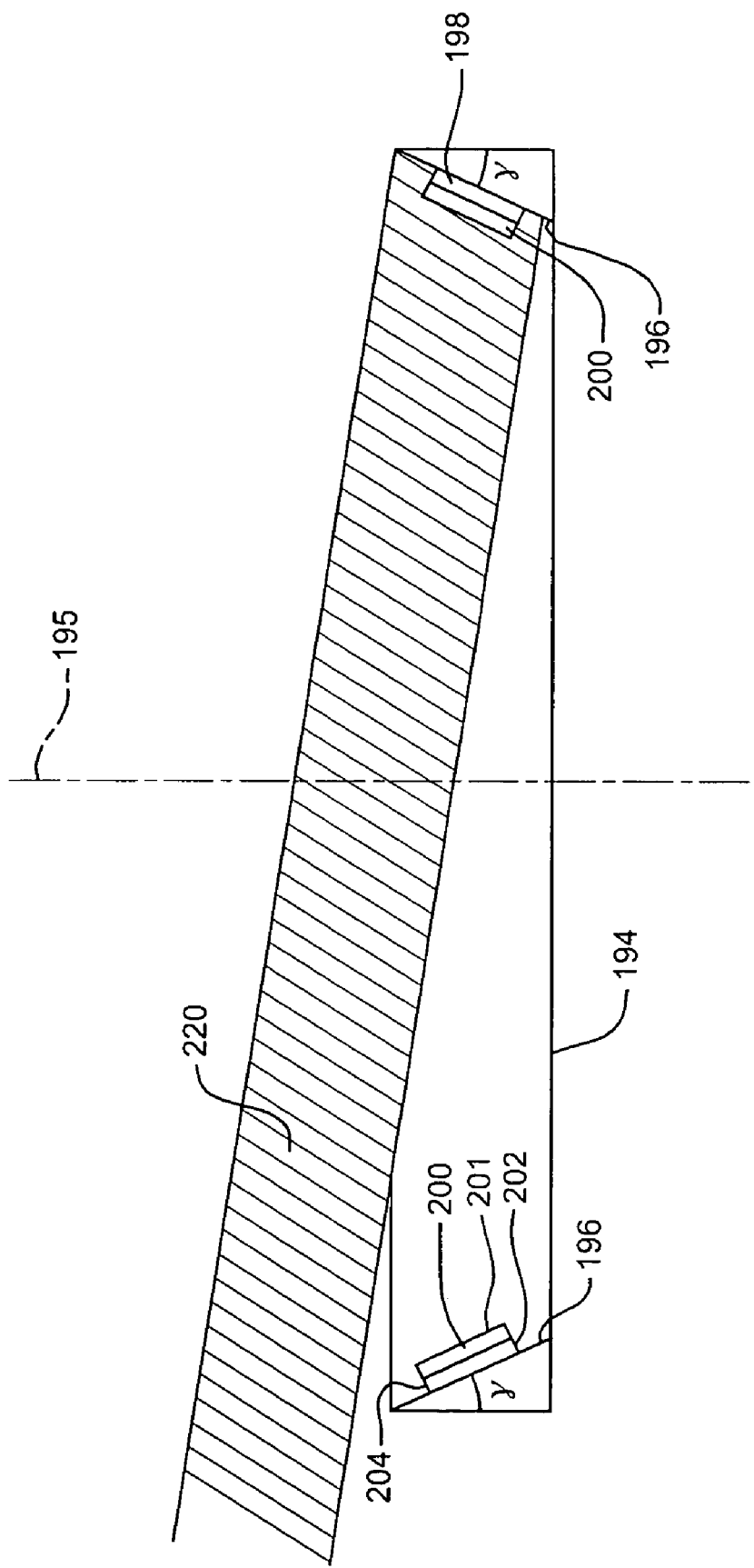
FIG. 9 is a sectional view of the spinning drum appliance taken along the line 9-9.

With reference to FIGS. 8 and 9, the illustrative wafer appliance in the endstation 190 (FIG. 1) is a drum 192 comprising a circular partition 194 around an axis 195. The partition 194 has a conical interior side 196 and an exterior diameter of about 1 m. Forty square elastomeric pads 198 are disposed at equal spacing on the interior side 196 of the partition 194. Clamps (not shown) are configured to affix wafers 200 onto the pads 198. The pads 198 each have a bottom edge 202 closer to the axis 195 than a top edge 204, so that front faces 201 of the wafers 200 on the pads 198 make an angle γ of, e.g., about 5 degrees with the axis 195. The pads 198 are, illustratively, 150 mm on a side.

Referring again to FIG. 1, the drum 192 is transferable from a staging area 210 to a process chamber 212 for engagement with a control system 214. The control system 214 is configured to rotate the drum 192 around the axis 195 at several hundred rpm. In the process chamber 212 the drum is oriented so that the axis 195 is approximately perpendicular to the linear travel direction of the beamlets through the implanter 100 before the deflection by θ caused by the neutral filter 170. The drum is positioned so that ions exiting the neutral filter 170 along the exit beamlet pathways 188 project onto the interior side 196 of the drum 192 in a composite beam 220 forming an angle of about 90-θ with the axis 195 (FIGS. 8 and 9).

In an exemplary procedure using the high-current ion implanter 100 to prepare laminae from silicon wafers, the pads 198 on the drum 192 are each loaded with a 150-mm square monocrystalline silicon wafer, and the drum 192 is positioned in the process chamber 212. The process chamber 212 is pumped to low pressure, on the order of $10^{-6}$ Torr. The control system 214 is operated to rotate the drum 192 about the axis 195 at 283 rpm, the rotation forcing the wafers against the pads 198 with a force proportional to the square of the rotation rate. The compressive force promotes thermal contact between a wafer and its supporting pad 198, increasing the rate of heat removal from the wafer during implantation.

The hydrogen gas train 110 is operated to provide $H_2$ to the bucket source 120 at a rate of about 10 standard cubic centimeters per minute. The bucket ion source 120 is activated to generate a plasma having a density of about $5 \times 10^9/cm^3$ at a pressure of about $4 \times 10^{-5}$ T. The extraction apparatus 138 is operated to apply an extraction voltage of, e.g., 15 kV, impelling hydrogen ions from the field-free region 130 through the slits 133 in a beam apportioned into twenty-one beamlets. Singly-charged hydrogen ions in the beam constitute a current of about 150 mA.

The beamlets move along the extraction pathways 135 to the corresponding channels 161 in the multichannel linear accelerator 140. The voltage source 147 is operated to apply the sawtooth signal of amplitude 3 kV between the extraction apparatus 138 of the ion source 120 and the buncher drift block 146. At the end of the buncher drift block 146, hydrogen ions in the beamlets are bunched with an energy spread of about 3 keV.

The balanced RF voltage source 160 is operated to impel the ions in the bunched beamlets through the acceleration stages. As the bunched beamlets follow their respective beamlet pathways 163 through the linear accelerator 140, the energies of the hydrogen ions in the beamlets are increased by 32 keV in the first gap 151*a* and by an additional 64 keV in each of the second through sixth acceleration gaps 152*a*, 153*a*, 154*a*, 155*a* and 156*a*. The ion energies are increased by 32 keV in the final gap 157, bringing the hydrogen ion energies in the beamlets to about 400 keV.

The energy spread of the particle bunches is kept short through the 140 by appropriate longitudinal focusing of the phase at which the particles traverse each of the gaps 151*a*, 152*a*, 153*a*, 154*a*, 155*a* and 156*a*. At the final gap 157 the bunched beamlets may be defocused to improve the uniformity of the composite beam ultimately irradiating the wafers in the endstation 190.

The beamlets follow the beamlet pathways 163 out of the linear accelerator 140 and enter the multichannel neutral filter 140 along entry beamlet pathways 187. The dc voltage source of the multichannel neutral filter 140 is operated to apply 1.2 kV across the first and second blocks. The applied voltage gives rise to an electric field of 4 kV/cm across the interstices 180, corresponding to the bending radius of the electrodes 172 and 174. The applied field bends the trajectories of the hydrogen ions through the interstices 180 so that the hydrogen ions emerge from the filter 170 along the exit beamlet pathways 188, deflected from their trajectory on the entry beamlet pathways 187 by about 7 degrees. Extraneous neutral particles traveling with the beamlets are not deflected but stopped by the top electrodes 174 of the respective interstices 180.

The deflected hydrogen ion beamlets moving on the beamlet exit pathways 188 reach the surface of the wafers disposed on the drum 192 forming a composite beam 220 of about 150 mA. The intersection of the beam 220 with a wafer extends at least 150 mm parallel to the wafer face. Ions in the beam effect a rectangular swath 225 of hydrogen ion bombardment uniformly covering the faces of the wafers from top edges to bottom edges as the drum successively passes the wafers on the pads 198 through the ion beam. The bombarding hydrogen ions have energies of about 400 keV. The implant angle between the beam and the wafer face is variable across the face, between about 5 and about 12 degrees. The composite beam irradiates 220 the wafers disposed on the drum 192 until the time integral of the current of the composite hydrogen ion beam 220 illustratively corresponds to a hydrogen ion dose of, e.g., $7 \times 10^{16}$ ions/cm$^2$, or about ten to fifteen minutes.

The implanted hydrogen ions define cleave planes in respective wafers. The implanted wafers are removed from the ion implanter 100 and annealed to effect cleaving of laminae from the wafers at the cleave planes. The laminae may be about 4.0 µm thick. The laminae are suitable for making photovoltaic devices by further processing, as described in Srinivasan et al., earlier incorporated by reference.

Figure 10:
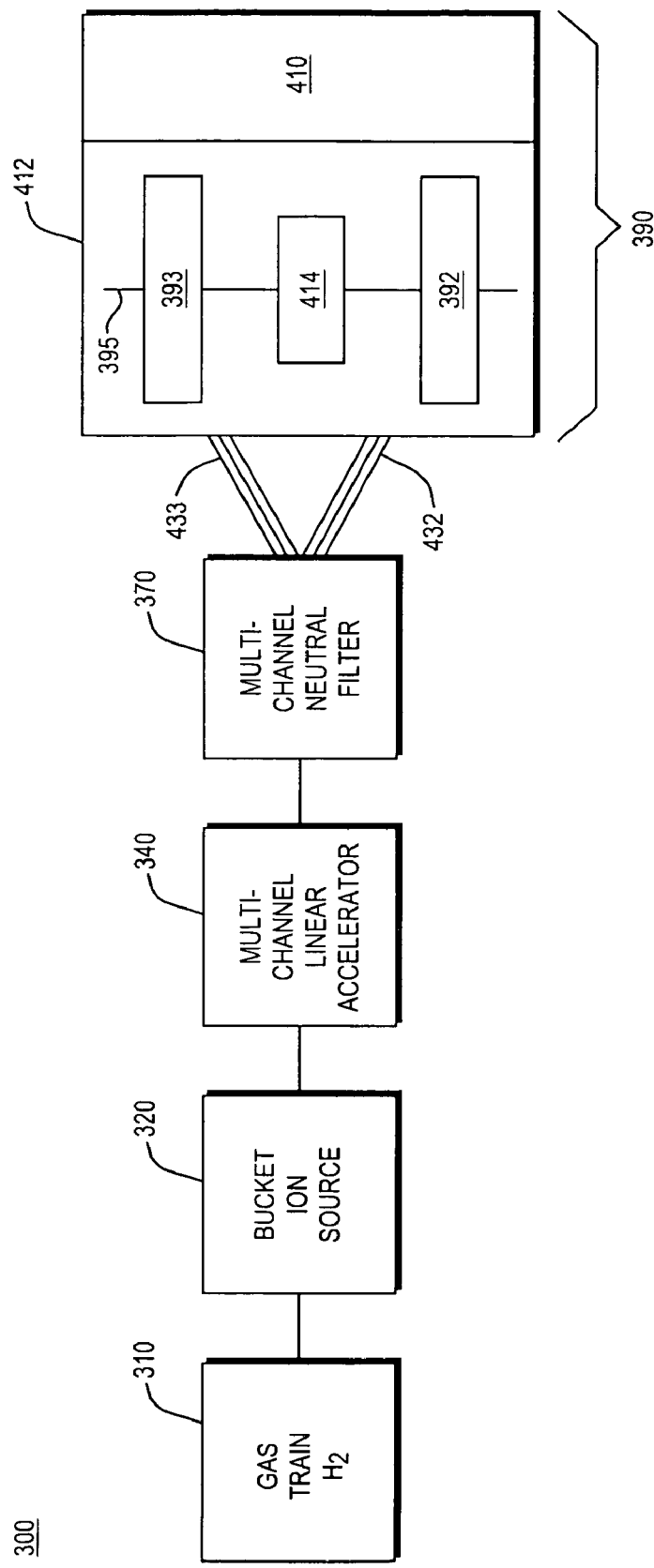
FIG. 10 is a block diagram of an inventive ion implanter, configured to implant hydrogen ions, with a double-drum endstation.

With reference to FIG. 10, in another illustrative embodiment, a high-current ion implanter 300 comprises a cylindrical bucket ion source 320, supplied with hydrogen through a gas train 310, a multichannel linear accelerator 340, an adjustable multichannel neutral filter 370, and a double-drum endstation 390.

The structure and function of the gas train 310, cylindrical bucket ion source 320 and multichannel linear accelerator 340 in implanter 300 are substantially the same as corresponding components 110 and 120 described above.

With reference to FIGS. 6 and 7, the adjustable multichannel neutral filter 370 has the structure and function of the neutral filter 170 in the implanter 100. Additionally, the filter 370 is supported to be toggled between a first orientation and a second orientation by rotating 180 degrees about an axis coinciding with the extrapolation 189. In the first orientation, the entrance face 182 is configured to receive hydrogen ion beamlets from the multichannel linear accelerator 320 and to dispatch the ion beamlets from the exit face 184 along first deflected pathways 432 shown in FIG. 10. In the second orientation, the entrance face 182 is configured to receive hydrogen ion beamlets from the multichannel linear accelerator 320 and to dispatch the ion beamlets from the exit face 184 along second deflected pathways 433.

The double-drum endstation 390 comprises first and second drums. The first and second drums are substantially identical to the drum 192 shown in FIGS. 8 and 9, each comprising a right cylindrical partition. Referring again to FIG. 10, the first and second drums are disposed in the endstation 390 so that they are alternately useable to bear wafers during an implantation process. The first drum is transferable from a staging area 410 to a first process position 392 engaged with a control system 414 in a process chamber 412. The second drum is transferable from the staging area 410 to a second process position 393 engaged with the control system 414. In the second process position 393 the second drum is held upside down compared to the first drum as held in the first process position 392, so that the top edges 204 of the pads 198 are closer to the axis 395 than the bottom edges 202 of the pads, forming a mirror image of the pads 198 of the first drum. The control system 414 is configured to rotate a drum in process position 392 or 393 about an axis 395 at several hundred rpm. The axis 395 forms an angle of 90-θ with the first 442 or second 443 beam trajectory, respectively.

In the first process position 392, the first drum is positioned so the first deflected pathways 432 project onto the interior side 196 of the first drum. In the second process position 393, the second drum is positioned so the second deflected pathways 433 project onto the interior side 196 of the second drum.

In another exemplary procedure, the high-current ion implanter 300 is used to prepare laminae from silicon wafers. The pads 198 on the first drum are each loaded with a 150-mm square monocrystalline silicon wafer, and the drum is positioned in the process chamber 410. The process chamber 410 is pumped to low pressure, on the order of $10^{-6}$ Torr. The control system 414 is operated to rotate the first drum about the axis 395 at 300 rpm, the rotation forcing the wafers against the pads 198 with a force proportional to the square of the rotation rate. The compressive force promotes thermal contact between a wafer and its supporting pad 198, increasing the rate of heat removal from the wafer during implantation.

The adjustable multichannel neutral filter 370 is positioned in the first orientation. The gas train 310, ion source 320 and multichannel linear accelerator 340 are operated as described above. The beamlets follow the beamlet pathways 163 out of the linear accelerator 340 and enter the multichannel neutral filter 340 along entry beamlet pathways 187. The dc voltage source of the multichannel neutral filter 370 is operated to apply 1.2 kV across the first and second blocks, causing bending of the trajectories of the hydrogen ions through the interstices 180. The hydrogen ion beamlets emerge from the filter 370 on the first deflected pathways 432, deflected from their trajectory on the entry beamlet pathways 187 by about 7 degrees.

The deflected hydrogen ion beamlets moving on the first deflected pathways 432 reach the surface of the wafers disposed on the first drum in the first process position 392, forming a composite beam constituting a current of about 150 mA. The intersection of the beam with a wafer extends at least 150 mm parallel to the wafer face. Ions in the beam effect a rectangular swath of hydrogen ion bombardment uniformly covering the faces of the wafers from the top edge to the bottom edges as the drum successively passes the wafers on the pads through the ion beam. The bombarding hydrogen ions have energies of about 400 keV. The implant angle between the beam and the wafer face is variable across a face, between about 5 and about 12 degrees. The composite beam irradiates the wafers disposed on the first drum until the time integral of the current of the composite hydrogen ion beam illustratively corresponds to a hydrogen ion dose of, e.g., $7 \times 10^{16}$ ions/cm$^2$, or about ten to fifteen minutes.

While the wafers on the first drum are being irradiated by hydrogen ions in the process chamber 412, the second drum is prepared in the staging area 410 for implantation. The pads 198 on the second drum are each loaded with a 150-mm square monocrystalline silicon wafer. When the irradiation of the first drum is concluded, it is removed from the process chamber 412 and the second drum engaged in the second process position 393. The process chamber 412 is evacuated.

The adjustable multichannel neutral filter 370 is moved into the second orientation. The control system 414 rotates the second drum about the axis 395 at 353 rpm. The bucket source 320 and multichannel linear accelerator 340 are operated as for implantation on the first drum. The multichannel neutral filter 370 directs hydrogen ion beamlets onto the second deflected pathways 433. The deflected beamlets reach the surface of the wafers disposed on the second drum, forming a composite beam constituting a current of about 150 mA. The intersection of the beam with a wafer extends at least 150 mm parallel to the wafer face. The bombarding hydrogen ions have energies of about 400 keV. Ions in the beam effect a rectangular swath of hydrogen ion bombardment uniformly covering the faces of the wafers from the top edge to the bottom edges as the drum successively passes the wafers on the pads through the ion beam. The implant angle between the beam and the wafer face is variable across a face, between about 5 and about 12 degrees. The composite beam irradiates the wafers disposed on the second drum until the time integral of the current of the composite hydrogen ion beam illustratively corresponds to a hydrogen ion dose of, e.g., $7\times10^{16}$ ions/cm$^2$, or about ten to fifteen minutes.

The implanted hydrogen ions define cleave planes in respective wafers processed on the first and second drums. The implanted wafers are removed from the ion implanter 300 and annealed to effect cleaving of laminae from the wafers at the cleave planes. The laminae are about 4.0 μm thick and suitable for making photovoltaic devices by further processing.

In one variation, the axis 395 is horizontal. The filter 370 and both of the first and second drums of the double-drum endstation 390 are oriented accordingly, with the pads 198 on the second drum forming a mirror image of the pads 198 on the first drum. In another variation, the endstation of the high-current ion implanter 300 may have two distinct process chambers (not shown). Each of the process chambers may hold a drum, such as either of the drums 392 or 393, in a fixed process position and be equipped with wafer-handling apparatus for loading and unloading wafers onto pads on its drum in its process position. A gate valve (not shown) between each of the two process chambers and the multichannel neutral filter 370 may be configured to allow elective exposure of the disk in either of the process chambers to the composite ion beam. During the implantation procedure, the gate valves may be adjusted so that while the disk in one of the process chambers is being irradiated, the other disk may be isolated from the multichannel neutral filter 370, while being loaded with wafers and otherwise prepared for implantation. In this variation, some or all of the wafer-handling apparatus may be common to both process chambers.

Figure 11:
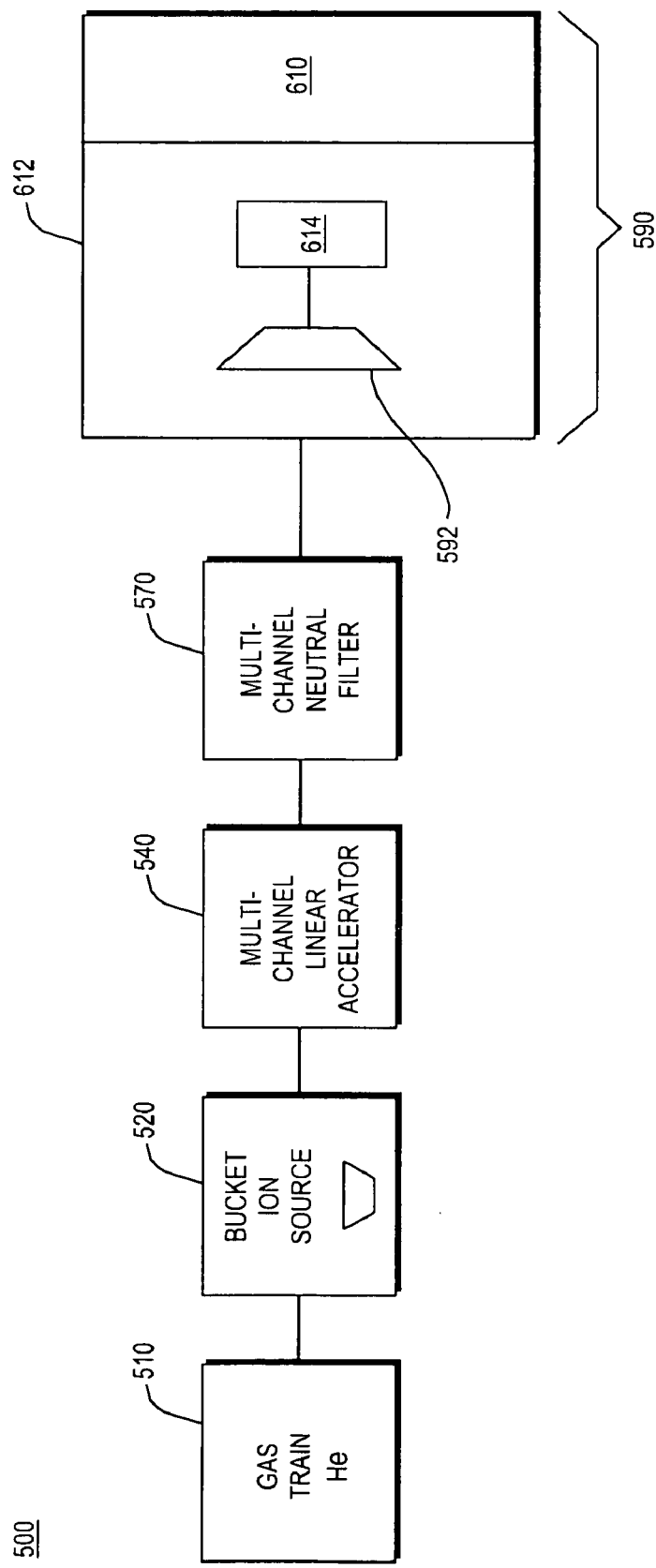
FIG. 11 is a block diagram of an inventive ion implanter, configured to implant helium ions, with a rotatable disk endstation.

With reference to FIG. 11, in another illustrative embodiment, a high-current ion implanter 500 comprises a cylindrical bucket ion source 520, supplied by a helium gas train 510, a multichannel linear accelerator 540, a multichannel neutral filter 570, and an endstation 590 housing a disk 592.

The gas train 510 includes a helium gas source connected to a flow controller configured to provide hydrogen gas to the ion source 520 at a flow rate of about 10 sccm.

Figure 12:
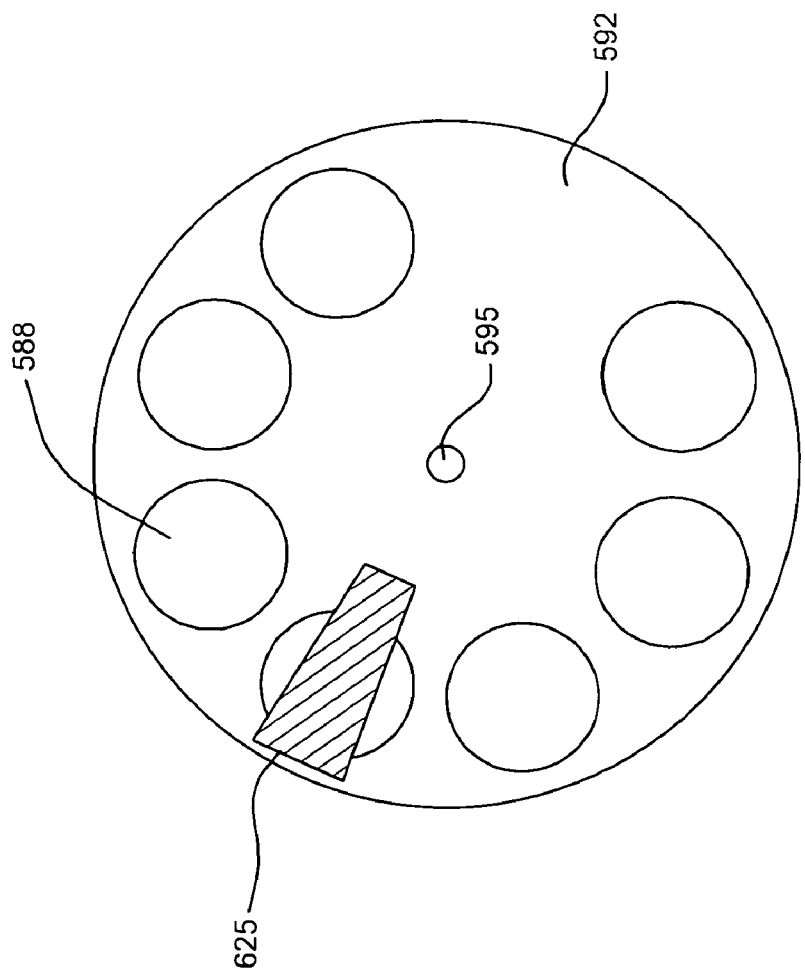
FIG. 12 is a front view of a rotatable disk appliance, compatible with the invention, configured to support round wafers.

In the endstation 590, a disk 592 is transferable from a staging area 610 to a process chamber 612 for engagement with a control system 614. With reference to FIG. 12, the disk 592 has a central axis 595 around which round pads 588 are disposed in an annulus. Each pad is 200 mm in diameter. The contour of the face of the disk is a small-angle cone so that the pads 588 slope toward the axis 595. The control system 614 is configured to rotate the disk 592 about the axis 595 at several hundred rpm.

Figure 13:
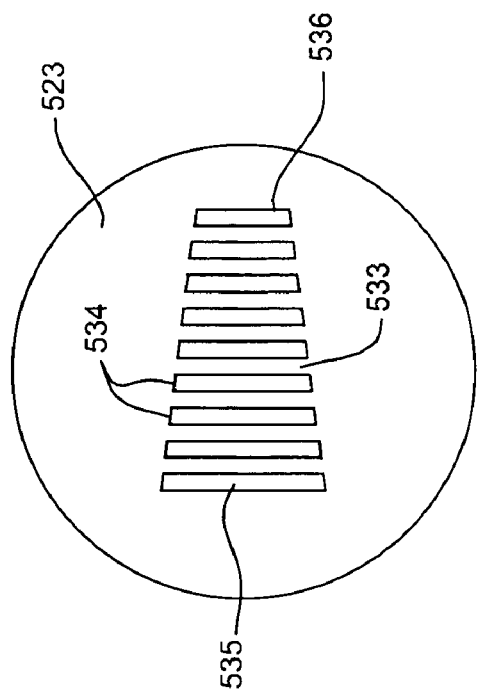
FIG. 13 is a front view of an extraction face of a bucket ion source compatible with the invention.

With reference to FIG. 13, the extraction face of the cylindrical bucket helium ion source 520 has an apertured end 523 with twenty-one fixed vertical slits 533 forming a trapezoidal profile 534 centered on the apertured end 523. The slit at the wider end 535 of the profile 534 is about 18 cm long. The slit at the narrower end 536 is about 16 cm long, with the remaining slits 533 varying in length with the reciprocal of distance from the narrower end 536. The length of the profile 534 perpendicular to the length of the slits 533 is about 17 cm. The extraction apparatus is configured to apply a fixed extraction voltage across the slits 533.

The bucket source 540 is oriented in the linear accelerator 500 so that the beamlets extracted from the narrower end 536 of the profile 534 irradiate the disk 592 closest to the axis 595. The permanent magnets 126 on the apertured end 523 are not shown.

The cylindrical bucket ion source 540 is otherwise essentially identical in structure and function to the bucket source 140 shown in FIGS. 2 and 3. Similarly, the multichannel linear accelerator 540 and the multichannel neutral filter 570 are structured like the corresponding components 140 and 170 in the ion implanter 100, adjusted for use with helium ions in aspects apparent to those skilled in the art.

In yet another exemplary procedure, the high-current ion implanter 500 is used to prepare laminae from silicon wafers. The pads 598 are each loaded with a 200-mm round monocrystalline silicon wafer, and the disk 592 is positioned in the process chamber 612. The process chamber 612 is pumped to low pressure. The control system 614 is operated to rotate the disk 592 about the axis 595 at 785 rpm, the rotation forcing the wafers against the pads 598 with a force proportional to the square of the rotation rate.

The gas train 510 and ion source 520 are operated to produce a plasma containing helium ions and having density equal to $1\times10^{10}$ cm$^3$. The multichannel linear accelerator 540 is operated as described above. Helium ion beamlets emerge from the filter 570 deflected from their trajectory on the entry beamlet pathways by about 7 degrees. The helium ion beamlets reach the surface of the wafers disposed on the disk 592, forming a composite beam constituting a current of about 150 mA. The intersection of the beam with a wafer extends at least 200 mm parallel to the wafer face. Ions in the beam effect a trapezoidal swath 625 of helium ion bombardment uniformly covering the faces of the wafers from the top edge to the bottom edges as the disk 592 successively passes the wafers on the pads through the ion beam. The trapezoidal profile of the swath 625 provides a 1/r compensation factor for the inherent dose variation along the radius of the disk 592.

The bombarding helium ions have energies of about 400 keV. The implant angle is about ten degrees. The composite beam irradiates the wafers disposed on the disk 592 until the time integral of the current of the composite hydrogen ion beam illustratively corresponds to a hydrogen ion dose of, e.g., $7\times10^{16}$ ions/cm$^2$, or about ten to fifteen minutes.

The implanted helium ions define cleave planes in respective wafers processed on the disk 592. The implanted wafers are removed from the ion implanter 500 and annealed to effect cleaving of laminae from the wafers at the cleave planes. The laminae are about 2.1 μm thick and suitable for making photovoltaic devices by further processing.

In a variation, the endstation (not shown) of the high-current ion implanter 500 may be configured to house the disk 592 at a fixed position, readily accessible at atmospheric pressure by an operator or a robotic interface, in process chamber serving also as staging area. A gate valve (not shown) between the multichannel neutral filter 570 and the process chamber may be configured to allow elective exposure of the disk 592 to the composite beam. During the implantation procedure, the pads 598 may be loaded with silicon wafers in the process chamber, with the gate valve adjusted to isolate the process chamber from the multichannel neutral filter 570. After loading, the process chamber is evacuated. Then, the gate valve is adjusted to allow irradiation of the disk 592 by the composite beam directed by the filter 570.

Although specific features of the invention are included in some embodiments and not in others, it should be noted that each feature may be combinable with any or all of the other features in accordance with the invention.

It will therefore be seen that the foregoing represents an advantageous and cost-effective approach to providing ion implanters for implanting at process currents and implant energies compatible with high-volume, economical preparation of semiconductor laminae for solar cell fabrication. The terms and expressions employed herein are used as terms of description and not of limitation, and there is no intention, in the use of such terms and expressions, of excluding any equivalents of the features shown and described or portions thereof, but it is recognized that alterations and various modifications are possible within the spirit and scope of the invention claimed.

What is claimed is:

1. A method of making a lamina for fabricating a photovoltaic device, the method comprising:
   providing a semiconductor wafer;
   configuring an appliance to hold the wafer;
   configuring an ion source to supply hydrogen or helium ions in beam lets;
   installing the semiconductor wafer in the appliance;
   operating the ion source to generate a plurality of ion beamlets;
   directing the plurality of ion beam lets toward the appliance in a beam constituting a current of at least 20 mA of hydrogen or helium ions, thereby implanting the directed ion beam lets in the wafer at a depth defining a cleave plane; and
   annealing the wafer to effect cleaving of a lamina from the wafer at the cleave plane, the lamina being at least 1 μm thick and suitable for use in a photovoltaic device.

2. The method of claim 1 further comprising:
   providing voltage apparatus configured to accelerate ions supplied by the ion source; and
   operating the voltage apparatus to accelerate ions in the plurality of ion beam lets to an energy of at least 100 keV.

3. The method of claim 2 wherein the voltage apparatus comprises a buncher and a linear accelerator and the operating the voltage apparatus to accelerate ions in the plurality of ion beam lets comprises:
   operating the buncher to bunch each of the plurality of ion beam lets; and
   operating the linear accelerator to accelerate ions in the bunched beamlets.

4. The method of claim 2 further comprising:
   providing a filter having
      a first array of first curved parallel electrodes at a first potential, and
      a second array of second curved parallel electrodes at a second potential, the second electrodes being parallel to and interleaved with the first electrodes, creating curved interstices, having a bending radius, between adjacent first and second electrodes, the first and second potentials bending ions entering the curved interstices to follow the bending radius through the interstices; and
   passing the plurality of ion beam lets simultaneously through respective curved interstices after the operating the voltage apparatus to accelerate ions in the plurality of ion beam lets, thereby removing neutral particles from the beam lets.

5. The method of claim 2 wherein the energy is at least 300 keV.

6. The method of claim 1 wherein the current is at least 100 mA.

7. The method of claim 1 wherein the appliance comprises a disk having a radius, configured to rotate about an axis, and bearing pads, configured to hold respective semiconductor wafers having respective front surfaces, wherein the beam has a varying width perpendicular to the radius, the width being proportional to the reciprocal of radial position, and further comprising rotating the disk about an axis of rotation, fixed in space.

8. The method of claim 1 wherein the ion source is a bucket source comprising an extraction face having a plurality of slits and wherein the operating the ion source to generate a plurality of ion beam lets comprises extracting respective beam lets through the slits.

9. The method of claim 8 wherein the beam is trapezoidal in cross section.

10. The method of claim 1 wherein implanting the directed ion beam lets lays a dose of at least $5 \times 10^{16}$ ions/cm$^2$ in the wafer.

11. The method of claim 1 wherein the lamina is at least 3 μm thick.

12. The method of claim 1 wherein the wafer is monocrystalline silicon.

13. The method of claim 1 wherein the appliance comprises a partition having an interior side and pads, configured to hold respective semiconductor wafers having respective front surfaces, disposed on the interior side and further comprising rotating the partition about an axis equidistant from the front surfaces of the wafers, thereby successively passing the front surfaces of the wafers through the beam.

14. The method of claim 13 wherein the axis is parallel to the front surfaces of the wafers.

15. The method of claim 13 wherein the axis makes the same angle with each of the front surfaces.

\* \* \* \* \*